US006403238B1

(12) United States Patent
Hörhold et al.

(10) Patent No.: US 6,403,238 B1
(45) Date of Patent: Jun. 11, 2002

(54) ORGANIC LIGHT-EMITTING DIODES (OLED) INCLUDING POLY[2-METHOXY-5-(2'-ETHYL-HEXYLOXY)-1,4-PHENYLENE-1, 2-ETHENYLENE-2,5-DIMETHOXY-1,4-PHENYLENE-1,2-ETHENYLENE] AS ELECTROLUMINESCENT MATERIAL

(76) Inventors: Hans-Heinrich Hörhold, Sanddornstrasse 2, 07747 Jena; Steffen Pfeiffer, August-Bebel-Strasse 6, 07952 Pausa; Albrecht Uhlig, Germanenstrasse 3, 12524 Berlin; Günter Heine, Weydemeyer Strasse 5, 10178 Berlin; Manfred Helbig, Unter dem Hospitale 14, 07778 Dorndorf-Steudnitz, all of (DE)

( * ) Notice: Subject to any disclaimer, the term of this patent is extended or adjusted under 35 U.S.C. 154(b) by 0 days.

(21) Appl. No.: 09/346,149

(22) Filed: Jul. 9, 1999

(30) Foreign Application Priority Data

Jul. 10, 1998 (DE) .......................... 198 32 644

(51) Int. Cl.$^7$ ............................. H05B 33/14
(52) U.S. Cl. ................. 428/690; 428/917; 313/504; 313/506; 257/40; 257/103; 427/66
(58) Field of Search ................ 428/690, 917; 313/504, 506; 257/40, 103; 252/301.35; 427/66

(56) References Cited

U.S. PATENT DOCUMENTS

| 5,247,190 A | | 9/1993 | Friend et al. ................ 257/40 |
| 5,401,827 A | * | 3/1995 | Holmes et al. ............. 528/374 |
| 5,408,109 A | | 4/1995 | Heeger et al. ............... 257/40 |
| 5,719,467 A | | 2/1998 | Antoniadis et al. ......... 313/506 |
| 5,759,709 A | * | 6/1998 | Doi et al. .................... 428/690 |

FOREIGN PATENT DOCUMENTS

| DE | 51436 | 11/1966 |
| DE | 84272 | 9/1971 |

OTHER PUBLICATIONS

S. Pfeiffer et al., "Synthesis of soluble MEH–PPV and MEH–PPB by HORNER condensation polymerization", Synthetic Metals, vol. 101, pp. 109–110, May 1999.*

J.H. Burroughes et al.; Light–emitting Diodes Based on Conjugated Polymers; Nature, vol. 347, Oct. 11, 1990; pp. 539–541.

C.W. Tang et al.; Organic Electroluminescent Diodes; Appl. Phys. Lett. 51(12) Seo. 27, 1987; pp. 913–915.

D. Braun et al.; Visible Light Emission from Semiconducting Polymer Diodes; Appl. Phys. Lett 58(18) May 6, 1991 pp. 1982–1984.

* cited by examiner

*Primary Examiner*—Marie Yamnitzky
(74) *Attorney, Agent, or Firm*—Norris, McLaughlin & Marcus P.A.

(57) ABSTRACT

The invention relates to the use of the new poly(p-phenylenevinylene) derivative, poly[2-methoxy-5-(2'-ethyl-hexyloxy)-1,4-phenylene-1,2-ethenylene-2,5-dimethoxy-1, 4-phenylene-1,2-ethenylene] (M3EH-PPV) as electroluminescent material. The invention is also directed to organic light-emitting diodes (OLEDs) based on the above material, which diodes are remarkable for a significantly increased operating temperature range, as well as to a process for manufacturing said OLEDs by applying said M3EH-PPV directly from a solution in the form of a film onto the substrate or the coated substrate.

8 Claims, 2 Drawing Sheets

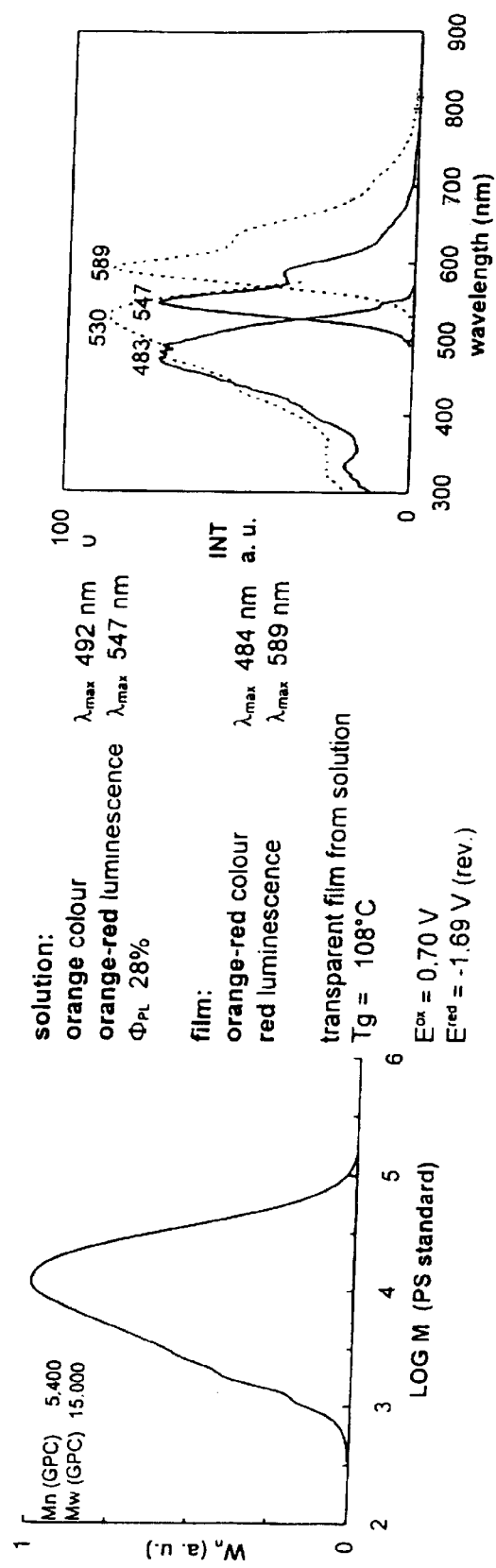
Fig. 2: M3EH-PPV

ORGANIC LIGHT-EMITTING DIODES (OLED) INCLUDING POLY[2-METHOXY-5-(2'-ETHYL-HEXYLOXY)-1,4-PHENYLENE-1, 2-ETHENYLENE-2,5-DIMETHOXY-1,4-PHENYLENE-1,2-ETHENYLENE] AS ELECTROLUMINESCENT MATERIAL

BACKGROUND OF THE INVENTION

The invention relates to the use of the new poly(p-phenylenevinylene) derivative, poly[2-methoxy-5-(2'-ethyl-hexyloxy)-1,4-phenylene-1,2-ethenylene-2,5-dimethoxy-1, 4-phenylene-1,2-ethenylene] (M3EH-PPV) as electroluminescent material. The invention is also directed to organic light-emitting diodes (OLEDs) based on the above material, which diodes are remarkable for a significantly increased operating temperature range, as well as to a process for manufacturing said OLEDs by applying said M3EH-PPV directly from a solution in the form of a film onto the substrate or the coated substrate.

The availability of semi-conducting organic polymers and the demonstration of suitability of these conjugated polymers in the production of light-emitting components [J. H. Bouroughes et al., Nature 347, 539 (1990); Tang, VanSlyke, Appl. Phys. Lett. 51, 913, (1987)] marked the onset of world-wide extensive work on developing organic luminescent diodes and, based thereon, on displays as well. In contrast to inorganic LEDs based essentially on ternary and quaternary $A_3B_5$ compounds, which can be used in displays of higher resolution only up to a point and at high cost, the organic emitters are rated to have an enormous potential for cost-minimized displays. In contrast to liquid crystal displays, electroluminescent displays have the advantage of being self-luminous and thus, do not require an additional rear light source.

Based on LEDs including conjugated polymers, it has been possible to accomplish both large area luminous surfaces and high-resolution displays. The principal structure of these luminous cells is illustrated in FIG. 1. In this example, the luminous polymer is embedded between a hole-donating contact layer, frequently consisting of indium tin oxide (ITO), and an electron-injecting contact layer (Ca/Al, Al, Mg/Ag). In this case, a light-transmitting material such as glass or plastic, e.g., PET is used as substrate. Further optimizations of the component structures, such as introducing additional electron-transporting layers, hole-transporting layers, and separating the charge carrier-transporting layers from the recombination zone resulted in a substantially increased performance of the components with respect to efficacy, luminance and lifetime.

A material frequently used for OLEDs, which is both hole-transporting and relevant for recombination, is poly[2-methoxy-5-(2'-ethylhexyloxy)-1,4-phenylenevinylene1] (n>5) referred to as MEH-PPV.

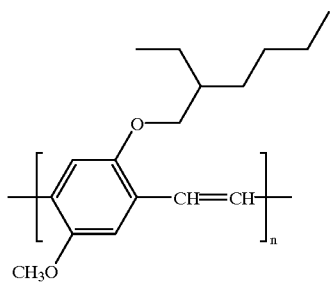

This polymer represents a special PPV derivative which is soluble and can be applied onto the substrate using suitable techniques such as knifing or spin coating.

Using MEH-PPV, it has been possible to produce both single-layer structures and multi-layer structures with success. Using said material, it has been possible to produce diodes having very high quantum yields in the case of single-layer structures [Braun and Heeger; Appl. Phys. Lett. 58, 1982, (1991)].

SUMMARY OF THE INVENTION

Although good results have been achieved by using MEH-PPV, it would certainly be possible to further improve the general properties of the OLEDs. For example, one drawback of MEH-PPV is its relatively low glass transition temperature (Tg) of $\leq 68°$ C., limiting the operating temperature range of OLEDs based on this material and thus, their applicability.

It was therefore the object of the present invention to provide organic light-emitting diodes (OLEDs) having improved general properties.

Surprisingly, the new PPV derivative, poly[2-methoxy-5-(2'-ethylhexyloxy)-1,4-phenylene-1,2-ethenylene-2,5-dimeth-oxy-1,4-phenylene-1,2-ethenylene] (M3EH-PPV), which has at least 5 repeat units of the following formula

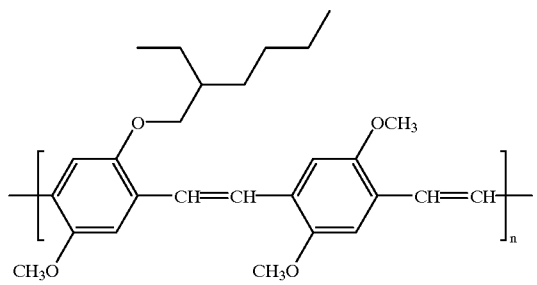

was shown to be a completely soluble semiconductor material which is film-forming from a solution and is particularly suited as an electroluminescent material.

Having nearly equivalent optical properties, M3EH-PPV surprisingly has improved thermal properties compared to MEH-PPV. Thus, the glass transition temperature (Tg) of M3EH-PPV measured using differential scanning calorimetry (DSC) is 108° C., being 40 K above that of MEH-PPV. The properties of the M3EH-PPV according to the invention are summarized in FIG. 2.

M3EH-PPV can be prepared using condensation polymerization of 2-methoxy-5-(2'-ethylhexyloxy) terephthalaldehyde and 2,5-dimethoxy-p-xylylenebis (diethyl-phosphonate) under the action of a strongly basic condensation agent such as potassium tert-butylate, sodium ethylate or sodium hydride in an organic solvent such as for instance benzene, chlorobenzene, toluene, or xylene according to the HORNER METHOD (cf., e.g., DD 51 436, D 84 272). A second and more cost-effective way of prepation is presented by the inverse condensation polymerization of 2,5-dimethoxyterephthalaldehyde with 2-methoxy-5-(2'-ethylhexyloxy)-p-xylylenebis(diethyl-phosphonate), because 2,5-dimethoxyterephthalaldehyde is a more readily available starting material compared to 2-methoxy-5-(2'-ethylhexyloxy)terephthalaldehyde.

The bisphosphonates required as condensation components are readily available from the corresponding bis(halomethyl) compounds and triethylphosphite using the Michaelis-Arbusov Reaction, for example.

Owing to the significantly higher Tg value, the use of M3EH-PPV as electroluminescent material in organic light-emitting diodes (OLEDS) results in OLEDs having an extended operating temperature range and thus, provides more user-friendly components. The invention is therefore directed to OLEDs including one or more active layers coated on a substrate, at least one of the light-emitting active layers being constituted of M3EH-PPV. In the meaning of the invention, "active layer" is to denote that the layer is capable of emitting light (light-emitting layer) when applying an electric field, and/or that it will improve the injection and/or transport of positive and/or negative charges (charge injection or charge transport layer). Thus, the OLEDs of the invention in their most elementary variant may comprise a charge carrier-injecting contact layer coated on the substrate, on which contact layer the light-emitting M3EH-PPV layer is situated, which is covered by a second contact layer injecting charge carriers of the opposite sign, wherein one of the contact layers must be optically transparent.

As a result of the solubility of the material according to the invention, the M3EH-PPV may also be used as a blend with other electrically active materials.

For building up the OLEDs of the invention, all the layer structures and materials are possible, in principle, which are known to a person skilled in the art and used for such layers, such as those described in U.S. Pat. No. 5,408,109, U.S. Pat. No. 5,247,190 or U.S. Pat. No. 5,719,467. Conventionally, the OLEDs include an electroluminescent layer between a cathode and an anode, wherein at least one of the electrodes must be transparent. In addition, one or more electron injection and/or electron transport layers may be introduced between the electroluminescent layer and the cathode, and/or one or more hole injection and/or hole transport layers may be introduced between the electroluminescent layer and the anode. Metals or metallic alloys, e.g., Ca, Mg, Al, In, Mg/Ag may be used as cathode. Metals such as Au or other metallic, conductive materials, e.g. ITO, on a transparent substrate may be used as anode.

In operation, the cathode is set to a negative potential with respect to the anode. As a result, electrons are injected from the cathode into the electron injection layer/electron transport layer or directly into the light-emitting layer. At the same time, holes are injected from the anode into the hole injection layer/hole transport layer or directly into the light-emitting layer.

Under the influence of an applied voltage, the injected charge carriers will move towards each other through the active layers. This results in electron/hole pairs at the boundary surface between the charge transport layer and the light-emitting layer or within the light-emitting layer, which pairs recombine with emission of light. According to the invention, however, the only crucial issue is that the light-emitting layer or one of the light-emitting layers is constituted of M3EH-PPV.

The invention is also directed to a process for producing the OLEDs of the invention, wherein the M3EH-PPV is applied in the form of a film directly from a solution onto the substrate or the coated substrate by knifing or spin coating, for example, and the solution may optionally contain other electrically active materials forming films from a solution. These methods are well-known to a person skilled in the art. In a particularly preferred embodiment of the invention, solutions of M3EH-PPV in tetrachloroethane are used.

BRIEF DESCRIPTION OF THE DRAWINGS

FIG. 2 graphs showing properties of the M3EH-PPV

DESCRIPTION OF THE PREFERRED EMBODIMENTS

Figure 1:
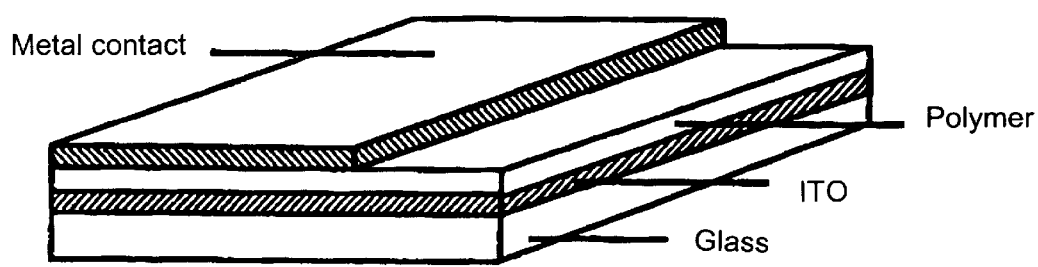
FIG. 1 basis structure of an organic light-emitting diode.

With reference to the embodiments, the invention will be illustrated in more detail below.

Tg: glass transition temperature, measured using differential scanning calorimetry (DSC)

MW: weight-average molecular weight

MD: number-average molecular weight

VPO: vapor pressure osmometry (cf., e.g., Cherdron, Kern, Brown, Praktikum der Makromolekularen Chemie)

GPC: gel permeation chromatography, polystyrene standard (PS)

EMBODIMENTS

EXAMPLE 1

Preparation of Poly[2-methoxy-5-(2'-ethylhexyloxy)-1,4-phenyl-ene-1,2-ethenylene-2,5-dimethoxy-1,4-phenylene-1,2-ethenylene] (M3EH-PPV)

2-Methoxy-5-(2'-ethylhexyloxy)terephthalaldehyde (2.92 g; 10 mmol) and 2,5-dimethoxy-p-xylylenebis(diethyl-phosphonate) (4.38 g; 10 mmol) are dissolved in toluene (100 ml) with heating and added with potassium tert-butylate (3.40 g; 30 mmol) under argon. The batch is heated to reflux for 4 hours. Following cooling, hydrolysis is effected using 10% hydrochloric acid (50 ml). The toluene phase is separated, washed with water and dried using a water separator. The solution is filtrated, concentrated and precipitated by pouring into methanol. The red powder is sucked off, extracted with methanol for 5 hours and subsequently dried to constant weight.

Yield: 3.0 g (72% of theoretical); $M_n$: 5,000 (GPC); $M_w$: 13,000 (GPC).

EXAMPLE 2

Alternative Preparation of M3EH-PPV 2,5-Dimethoxyterephthalaldehyde (1.94 g; 10 mmol) and 2-methoxy-5-(2'-ethylhexyloxy)-p-xylylenebis (diethylphosphonate) (5.37 g; 10 mmol) are dissolved in toluene (150 ml) with heating and added with potassium tert-butylate (3.40 g; 30 mmol) under argon. The batch is heated to reflux for 4 hours. Following cooling, hydrolysis is effected using 10% hydrochloric acid (50 ml). The toluene phase is separated, washed with water and dried using a water separator. The solution is filtrated, concentrated and precipitated by pouring into methanol. The red powder is sucked off, extracted with methanol for 5 hours and subsequently dried to constant weight.

Yield: 2.7 g (64% of theoretical); $M_n$: 5,400 (GPC); $M_w$: 15,000 (GPC); Tg (DSC): 108° C. FTIR: $v/cm^{-1}$: v (CH) 3059 (Ph); v (CH) and v (CH) 2955; 2929 and 2864 (aliphatic CH); 1597 and 1500 (phenyl ring); 1206 (Ph-O-C); v (CH) 968 (trans-vinylene). $^{13}$C-NMR (CDCl$_3$): δ/ppm: 151.4, 127.1, 123.2, 110.1, 109.0, 71.6, 56.5, 56.1, 39.7, 30.7, 29.0, 24.2, 23.1, 14.1, 11.3. $^1$H-NMR (CDl$_3$): δ/ppm: 7.5–6.8 (m, 8H), 3.9–3.8 (2s, 9H), 3.5 (d, 2H), 1.8–0.8 (m, 15H). $C_{27}H_{34}O_4$ (422.52); Calc.: C 76.75; H 8.11 Found: C 74.91; H 8.19.

EXAMPLE 3

OLED Production

A light-emitting diode was produced, consisting of an ITO(indium tin oxide)-coated glass pane (R=18Ω/□) which was coated on the ITO side with a M3EH-PPV film by means of spin coating. This film was produced from a solution of 1.5 mass-% M3EH-PPV in 1,1,2,2-tetrachloroethane. The resulting homogeneous polymer film had a layer thickness of about 100 nm. A Ca/Al contact (50 nm/200 nm) was applied onto this polymer film by vacuum deposition through a template. By using a template, the active area of the component was confined to 20 mm$^2$.

EXAMPLE 4

OLED Production

A light-emitting diode was produced, consisting of an ITO-coated glass pane (R=18Ω/□) which was coated on the ITO side with a M3EH-PPV film by means of spin coating. This film was produced from a solution of 1.5 mass-% M3EH-PPV in 1,1,2,2-tetrachloroethane. The resulting homogeneous polymer film had a layer thickness of about 100 nm. This polymer film was coated by spin coating with a second polymer layer as an electron-conducting layer, consisting of a mixture (80:20 wt.-%) of polystyrene (PS) and 2-(4-biphenyl)-5-(4-tert-butylphenyl)-1,3,4-oxadiazol. To this end, a 3 wt.-% solution of PS and oxadiazol in cyclohexane was used. The layer thickness was about 60 nm.

A Ca/Al contact (50 nm/200 nm) was vapor-deposited onto the above electron-conducting polymer layer by vacuum deposition at $8 \times 10_{-5}$ torr through a template. By using a template, the active area of the component was confined to 20 mm$^2$.

What is claimed is:

1. An organic light-emitting diode (OLED), comprising one or more light-emitting active layers embedded between two charge carrier-injecting contact layers coated on a substrate, at least one of the light-emitting active layers being constituted of a poly(p-phenylenevinylene) derivative (PPV derivative), wherein the PPV derivative is poly[2-methoxy-5-(2'-ethylhexyloxy)-1,4-phenylene-1,2-ethenylene-2,5-dimethoxy-1,4-phenylene-1,2-ethenylene] (M3EH-PPV) which has the following formula:

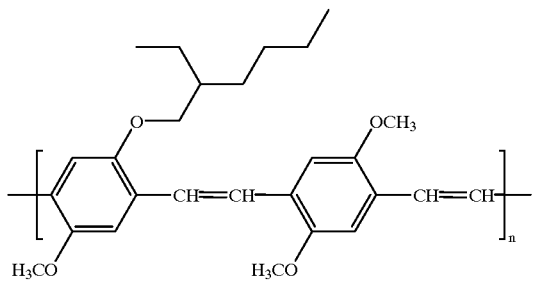

wherein n is at least 5.

2. The OLED of claim 1, wherein the light-emitting M3EH-PPV layer is situated on a first charge carrier-injecting contact layer coated onto a substrate and is covered by a second charge carrier-injecting contact layer of opposite sign relative to the first charge carrier-injecting contact layer, wherein one of the contact layers is optically transparent.

3. The OLED of claim 1, further comprising a hole-transporting contact layer and an electron-transporting contact layer, wherein the hole-transporting contact layer is situated between the light-emitting M3EH-PPV layer and the first charge carrier-injecting contact layer, and the electron-transporting contact layer is situated between the light-emitting M3EH-PPV layer and the second charge carrier-injecting contact layer.

4. The OLED according to claim 1, wherein the light-emitting M3EH-PPV layer has a thickness of from 10 nm to 1μm.

5. The OLED according to claim 1, wherein the light-emitting layer includes other electrically active materials in addition to M3EH-PPV.

6. A process for producing an organic light-emitting diode comprising one or more light-emitting active layers embedded between two charge carrier-injecting contact layers coated on a substrate, at least one of the light-emitting active layers being constituted of a poly(p-phenylenevinylene) derivative (PPV derivative), wherein the PPV derivative is poly[2-methoxy-5-(2'-ethylhexyloxy)-1,4-phenylene- 1,2-ethenylene-2,5-dimethoxy-1,4-phenylene-1,2- ethenylene] (M3EH-PPV) which has the following formula:

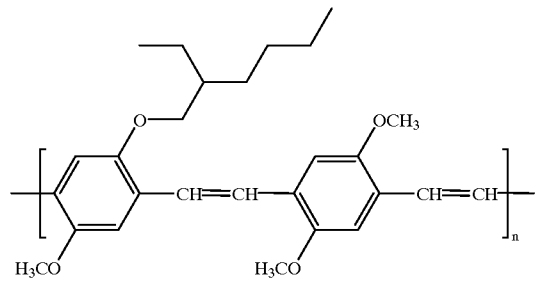

wherein n is at least 5, wherein the poly[2-methoxy-5-(2'-ethylhexyloxy)-1,4-phenylene-1,2-ethenylene-2,5-dimethoxy-1,4-phenylene-1,2-ethenylene], optionally blended with other electrically active materials, is directly applied from a solution in the form of a film onto the substrate.

7. The process of claim 6, wherein the M3EH-PPV is dissolved in an organic solvent.

8. The process of claim 7 wherein the organic solvent is tetrachloroethane.

* * * * *